United States Patent [19]
Yoshimori

[11] Patent Number: 5,597,759
[45] Date of Patent: Jan. 28, 1997

[54] METHOD OF FABRICATING A SEMICONDUCTOR INTEGRATED CIRCUIT DEVICE HAVING A CAPACITOR AND A RESISTOR

[75] Inventor: Masanori Yoshimori, Tokyo, Japan

[73] Assignee: NEC Corporation, Tokyo, Japan

[21] Appl. No.: 539,929

[22] Filed: Oct. 6, 1995

Related U.S. Application Data

[62] Division of Ser. No. 426,137, Apr. 21, 1995.

[30]   Foreign Application Priority Data

Apr. 21, 1994   [JP]   Japan .................................. 6-82909

[51] Int. Cl.⁶ .......................... H01L 21/70; H01L 27/00
[52] U.S. Cl. .................. 437/60; 437/919; 437/918
[58] Field of Search ...................... 437/918–919, 437/52, 60

[56]          References Cited

U.S. PATENT DOCUMENTS

| | | | |
|---|---|---|---|
| 4,367,580 | 1/1983 | Guterman | 437/918 |
| 4,419,812 | 12/1983 | Topich | 437/919 |
| 4,929,989 | 5/1990 | Hayano | 357/23.6 |
| 5,330,928 | 7/1994 | Tseng | 437/52 |
| 5,356,826 | 10/1994 | Natsume | 437/60 |

FOREIGN PATENT DOCUMENTS

| | | |
|---|---|---|
| 0418468 | 3/1991 | European Pat. Off. . |
| 58-26178 | 6/1983 | Japan . |
| 63-94664 | 4/1988 | Japan . |
| 6-61423 | 3/1994 | Japan . |

*Primary Examiner*—H. Jey Tsai
*Attorney, Agent, or Firm*—Young & Thompson

[57]          ABSTRACT

A semiconductor integrated circuit device includes a capacitor and a resistor in addition to a transistor. The capacitor includes a lower electrode made of a first polysilicon layer formed on an insulating layer covering the main surface of a semiconductor substrate, a dielectric film formed on the lower electrode and a upper electrode formed on the dielectric layer, whereas the resistor includes a resistor layer made of a second polysilicon layer formed on the insulating film. The first polysilicon layer has the same sheet resistance as the second polysilicon layer.

4 Claims, 5 Drawing Sheets

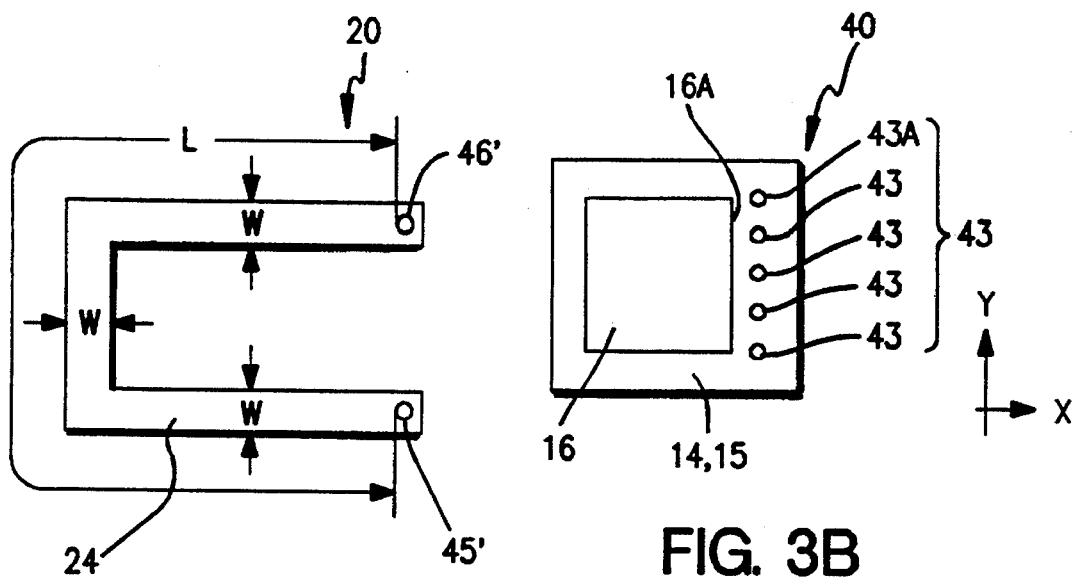
FIG. 3A
FIG. 3B
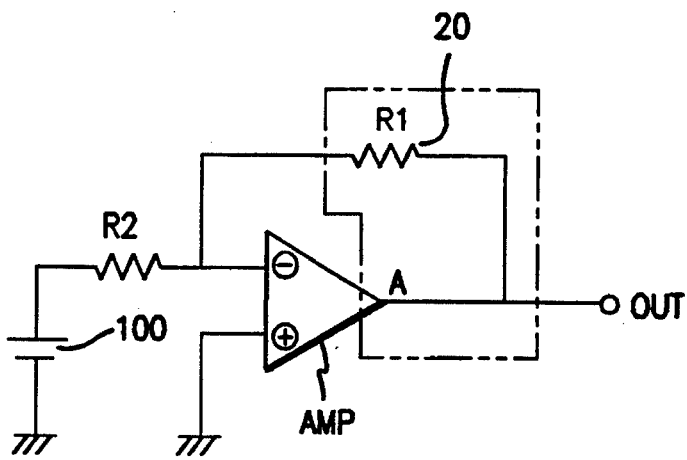
FIG. 4A
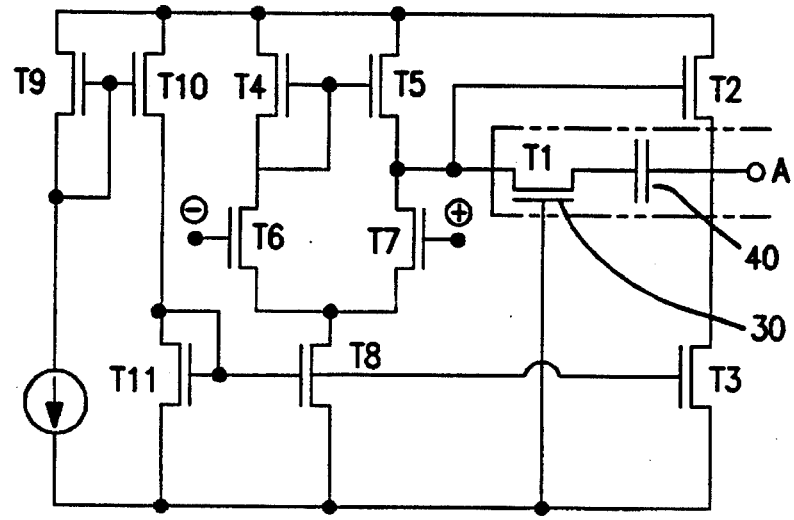
FIG. 4B

METHOD OF FABRICATING A SEMICONDUCTOR INTEGRATED CIRCUIT DEVICE HAVING A CAPACITOR AND A RESISTOR

This application is a division of application Ser. No. 08/426,137, filed Apr. 21, 1995.

BACKGROUND OF THE INVENTION

The present invention relates to a semiconductor integrated circuit device and a method for fabricating the same, and it relates, more particularly, to such a device that includes a resistor and a capacitor together with an insulated gate transistor on a single semiconductor substrate and to a method for fabricating the same.

A semiconductor integrated circuit device required not only insulated-gate field-effect transistors (hereinafter referred to as an IGFETs) but also one or more capacitors and one or more resistors. There are known various types of capacitors. As a typical capacitor, a metal-oxide-semiconductor (MOS) capacitor is employed. In the MOS capacitor, further, it is proposed in Japanese Patent Laid-open Publication No. SHO 63-94664 that the dielectric film is made of a stacked structure of a silicon nitride film and a silicon oxide film to reduce the leakage current and to increase the capacitance value.

There are also known various types of resistors. One of them is a polysilicon resistor formed on an insulating film covering the semiconductor substrate. This resistor is made of a polysilicon film with a certain sheet resistance and with certain width and length to present a required resistance value, as disclosed in Japanese Patent Publication No. SHO 58-26178.

Thus, the device including the IGFET, the capacitor and the resistor is constructed by such a structure as shown in FIG. 5.

Specifically, a field oxide film 2 is selectively formed on the main surface of a P-type silicon substrate 1 to define an active area for an IGFET 30. This IGFET 30 includes a gate oxide layer 34 formed on the active area of the substrate 1 and a gate electrode 35 of a polycide structure comprising a polysilicon layer 11 and a silicide film 12 formed on the gate oxide layer 34. A pair of N-type impurity regions 36 and 37 as a source and a drain are formed in a self-aligned manner with the gate electrode 35 and the field oxide layer 11.

On the other hand, a capacitor 60 and a resistor 70 are formed on the field oxide film 2. The capacitor 60 includes a lower electrode portion 64 and an electrode led-out portion 64A each made of a polysilicon layer with a low sheet resistance. Formed on the electrode portion 64 is a stacked dielectric film 65 comprising a silicon oxide film 61 and a silicon nitride film 62. An upper electrode 68 made of aluminum and the like is formed on the dielectric film 65.

The resistor 70 is formed on a polysilicon layer 74 with a sheet resistance higher than that of the polysilicon layer 64 (64A).

These FET 30, capacitor 60 and resistor 70 is covered with inter-layer insulation layer 71 such as a silicon oxide film in which contact holes 66 and 76 are selectively formed. An lower leading-out electrode 67 is connected through the contact hole 66 to the electrode led-out portion 64A, and an electrode 77 is connected through the connecting bore 76 to one end of the polysilicon layer 74 of the resistor 70.

In this semiconductor integrated circuit device, however, the higher sheet resistance polysilicon layer 74 is used as the resistor 70 and the lower sheet resistance polysilicon layer 64 (64A) is used as the lower electrode of the capacitor 60. These layers are therefore required to be deposited by the different steps. For this reason, an alignment error occurs in the relative position relationship between the resistor 70 and the capacitor 60, resulting in restriction in high densification. Moreover, the device fabrication becomes inevitably complicated to make the cost thereof high.

Furthermore, the interlayer insulating film 71 is deposited thick directly on the upper surface of the resistor layer 74. For this reason, the resistance value of the resistor 70 becomes unstable due to the stress from the insulating layer 71 and/or a movement of positive ions therethrough.

SUMMARY OF THE INVENTION

Accordingly, it is an object of the present invention to provide a semiconductor integrated circuit device and a method therefor, in which a capacitor and a resistor are formed with high integration and low cost.

Another object of the present invention is to provide a semiconductor integrated circuit device and a method therefor, in which a resistor is formed with a stable resistance value together with a capacitor.

Still another object of the present invention is to provide a semiconductor integrated circuit device and a method therefor, in which both of a capacitor and a resistor have a highly reliable contact structure can be obtained.

A semiconductor integrated circuit device according to a aspect of the present invention comprising an insulating film covering a semiconductor substrate, a resistor including a first polysilicon layer selectively formed on the insulating film and having a first sheet resistance, and a capacitor including a second polysilicon layer as a lower electrode selectively formed in the insulating film and having a second sheet resistance that is equal to the first sheet resistance, a dielectric film formed on the lower electrode and an upper electrode formed on the dielectric film.

It is preferable that the lower electrode and the dielectric film are formed into the same plane shape, the upper electrode being formed into a plane shape smaller than that of the dielectric film, and a plurality of contact holes are formed in line in the dielectric film to expose a plurality of parts of the lower electrode, an lead-out electrode is thereby connected through said contact holes to the respective parts of the lower electrode.

It is further convenient that the dielectric film of said capacitor has a stacked structure in which a silicon oxide film and a silicon nitride film are alternately stacked. Preferably, the stacked structure may be a three-layer structure of a lower silicon oxide film by the thermal oxidation of the polysilicon layer, an intermediate silicon nitride film on said lower silicon oxide film, and an upper silicon oxide film formed by the surface thermal oxidation of said silicon nitride film.

In accordance with another aspect of the present invention, there is provided a method of fabricating a semiconductor integrated circuit device comprising the steps of: selectively forming on a main surface of a semiconductor substrate a field insulating layer to define an active area in the semiconductor substrate; forming a first polysilicon layer to cover the field insulation layer and the active area; forming a first silicon oxide film on the first polysilicon layer; forming a silicon nitride film on the first silicon oxide film; forming a second silicon oxide film on the silicon nitride film; patterning the second silicon oxide film, the silicon nitride film, the first silicon oxide film and the first polysilicon layer to form a resistor body and a lower electrode of a capacitor each constructed by first and second parts of the first polysilicon layer and further form a dielectric film of the capacitor on the lower electrode constructed by respective parts of the first silicon oxide film, the silicon nitride film and the second silicon oxide film.

Preferably, the active region is thereafter covered with a gate insulating film, followed by depositing and patterning a second polysilicon layer to form an upper electrode of the capacitor and a gate electrode of a field effect transistor.

BRIEF DESCRIPTION OF THE DRAWINGS

This above-mentioned and other objects, features and advantages of this invention will become more apparent by reference to the following detailed description of the invention taken in conjunction with the accompanying drawings, wherein:

FIG. 3A is a plan view illustrating a part of a resistor shown in FIG. 1 and FIG. 3B is a plan view illustrating a part of a capacitor shown in FIG. 1;

FIG. 4A is block diagram illustrative of a reference voltage generator employed in an AD conversion circuit and FIG. 4B is a circuit diagram illustrative of an operational amplifier shown in FIG. 4A;

DETAILED DESCRIPTION OF THE PREFERRED EMBODIMENTS

Figure 1:
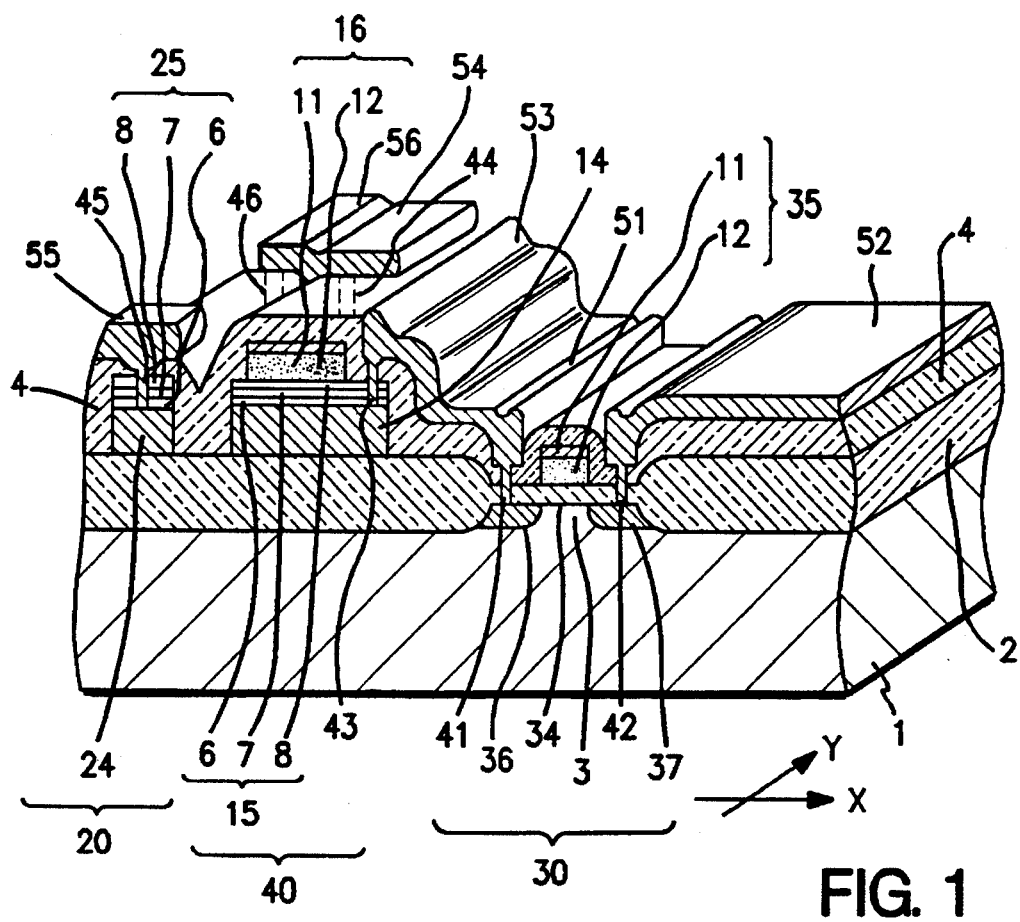
FIG. 1 is a perspective view illustrative of a semiconductor integrated circuit device according to an embodiment of the present invention.
Figure 5:
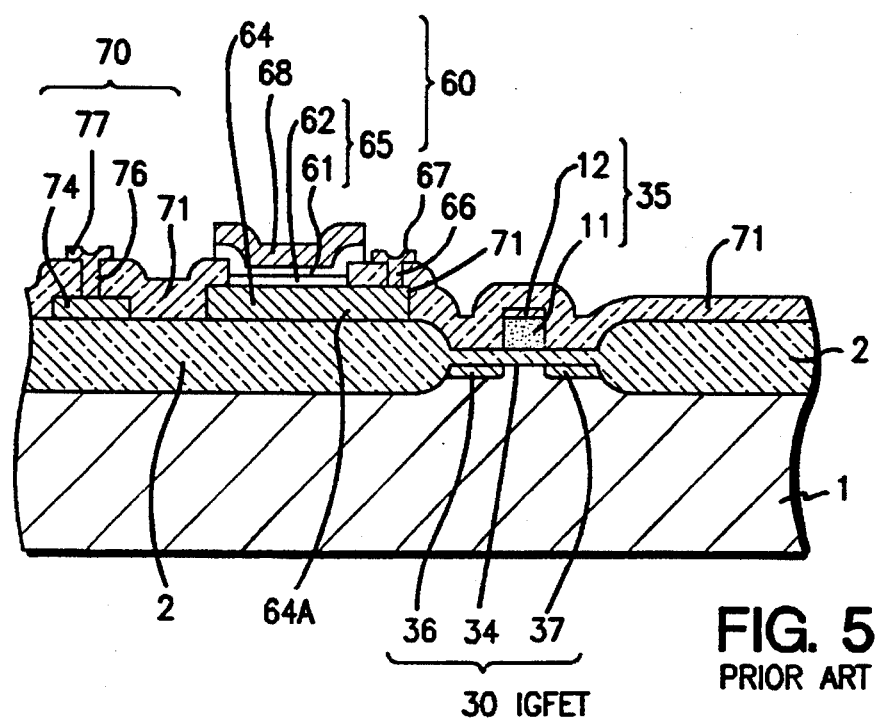
FIG. 5 is a sectional view showing a prior art semiconductor integrated circuit device.

Referring now to FIG. 1, there is shown a semiconductor integrated circuit device in accordance with an embodiment of the present invention. A field insulation layer 2 made of a silicon oxide film is selectively formed on the main surface of a P-type silicon substrate 1 to define an active device area 3 on which an IGFET 30 is formed. This IGFET 30 includes a gate electrode 35 formed on a gate oxide layer 34 covering the active device area 3. The gate electrode 35 is of a polycide structure which is a composite layer of a polysilicon layer 11 and a refractory metal silicide film 12. The gate electrode 35 thus has a sheet resistance of value of 10 $\Omega$/square ($\Omega/\square$). A pair of N-type impurity regions 36 and 37 as source and drain regions are formed in a self-aligned manner with the gate electrode 35 and the field oxide layer 2.

This device further has a capacitor 40 which is provided on one area of the field oxide film 2. This capacitor 40 includes a lower electrode 14, a dielectric film 15, and an upper electrode 16. The lower electrode 14 has, in this embodiment, a square plane shape whose one side is 16-µm and is constituted by a polysilicon layer having a sheet resistance of 40 $\Omega/\square$. The dielectric film 15 is constituted by a three-stacked layer structure of a silicon oxide film 6 in film thickness of 17 nm, a silicon nitride film 7 in film thickness of 15 nm, and a silicon oxide film 8 in film thickness of 5 nm stacked in that order. The upper electrode 16 also has a square plane shape smaller than the lower electrode and having one side of 12-µm. The upper electrode 16 is constituted by a polycide structure which is a composite layer of a polysilicon layer 11 and a silicide film 12 and whose sheet resistance (layer resistance) is 10 $\Omega/\square$. That is, the upper electrode 16 of the capacitor 40 and the gate electrode 35 of the IGFET 30 are exactly the same film constitution.

The device as shown in FIG. 1 further has a resistor 20 which is provided on another area of the field oxide film 2. This resistor 20 has a polysilicon layer 24 which is the same impurity concentration and the same film thickness as the lower electrode 14 of the capacitor 40 and thus presents the sheet resistance of 40 $\Omega/\square$.

Turning to FIG. 3A, the polysilicon layer 24 of the resistor 20 consists of resistance portion 24' having a width W of 5 µm and an effective length L of 50 µm and contact portions 45' and 46'. As shown, this film is formed in a U-letter. The resistor 20 thus constructed represents its resistance value of is 400 $\Omega$.

Turning back to FIG. 1 the upper surface of the polysilicon film 24 is covered by a protective insulation film 25 in the same plane shape as the film 24. This protective insulation film 25 is exactly the same stacked-film structure as the dielectric film 15 of the capacitor 40 and thus comprises a three-layer structure of a layer silicon oxide film 6 in film thickness of 17 nm, a silicon nitride film 7 in film thickness of 15 nm, and a silicon oxide film 8 in film thickness of 5 nm.

These IGFET 30, capacitor 40 and resistor 20 are covered with an inter-layer insulation film 4 such as a silicon oxide film, a PSG film, or a BPSG film. Contact holes 41 and 42 are provided in the inter-layer insulation film 4 to expose respective parts of the source and drain regions 36 and 37 of the IGFET 30. For the capacitor 30, a plurality of contact holes 43 are provided in the inter-layer insulation film 4 and the dielectric film 15 to expose a plurality of parts of the lower electrode 14, and a contact hole 44 is further formed in the inter-layer insulation film 4 to expose a part of the upper electrode 16.

For the resistor 20, contact holes 45 and 46 are formed in the inter-layer insulation film 4 and the protective insulation film 25 to expose the respective parts of the contact portions 45' and 46' of the polysilicon film 24.

Referring to FIG. 3B, five contact holes 43A to 43E as the holes 43 are formed for the lower electrode 14. These holes 43A to 43E are arranged in line along one side 16A of the upper electrode 16. The both end holes 43A and 43E corresponds to the both edges of the side 16A, and the remaining three holes 43B to 43D are provided therebetween. With the construction in contact holes thus formed, even if the lower electrode 14 has a relatively high sheet resistance film, it becomes uniform in electric potential. Accordingly, the desired and accurate capacitance value is obtained.

Turning back again to FIG. 1, metal electrodes 51 and 52 such as aluminum are connected through the contact holes 41 and 42 to the source and drain regions 36 and 37 of the IGFET 30, respectively. The end portion of the aluminum electrode 51 is further connected as an lower metal electrode 53 of the capacitor 40 through the contact hole 43 to the lower electrode 14. An upper metal electrode 54 made of aluminum is connected through the contact hole 44 to the upper electrode 16 of the capacitor 40. This electrode 54 continuous to an electrode 54 for the resistor 20 and thus is connected through the contact hole 46 to one end portion 46' of the polysilicon film 24. The other end portion 45' of the film 24 is connected through the contact hole 45 to an aluminum electrode 55.

Referring to FIG. 4A, there is shown a reference voltage generator employed in an A/D conversion circuit, which generator includes resistors R1 and R2, an operational amplifier AMP, and a reference voltage source 100. The output OUT of the amplifier AMP is inputted to an A/D converter (not shown). This operational amplifier AMP is constituted by IGFETs T1 to T11 and a capacitor, as shown in FIG. 4B. As shown in FIG. 4, the IGFET T1 is connected to one end of the capacitor C whose the other end is in turn connected to the one end of the resistor R1. That is, the device shown in FIG. 1 represents these three elements 30 (T1), 40 (C) and 20 (R1).

Figure 2A:
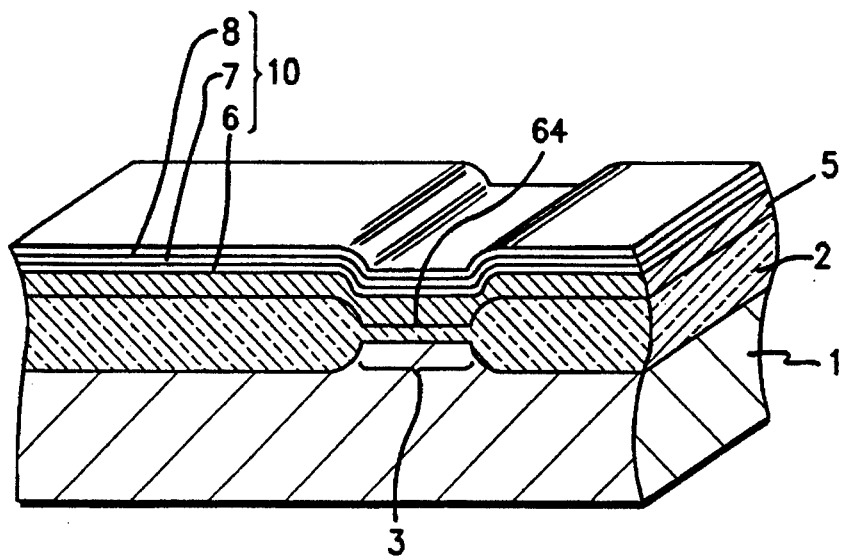
FIGS. 2A to 2F are perspective views illustrative of respective steps of a method according to an embodiment of the present invention.

The device as shown in FIG. 1 is fabricated as follows:

More specifically, as shown in FIG. 2A, the thick field oxide film 2 as a field insulating film is first formed on the main surface of the P-type silicon substrate 1 by the so-called selective oxidation method. The part of the film 2 is thus embedded into the substrate 1 to define the active region 3. The active region 3 is covered with a silicon oxide film 64. A polysilicon layer 5 containing N-type impurities to have the above sheet resistance is then formed over the entire surface. The surface of the polysilicon layer 5 is then oxidized by heat treatment to form the silicon oxide film 6 in thickness of 17 nm, the silicon nitride film 7 in film thickness of 15 nm is thereafter deposited on the film 5 by LPCVD (low-pressure chemical vapor deposition) or RTN (rapid thermal nitriding). The surface of the silicon nitride film 7 is then oxidized by heat treatment to form the silicon oxide film 8 in thickness of 5 nm. In this way, the stacked structure 10 is formed. Since the adhesion with the polysilicon layer 5 becomes good by the silicon oxide film 6 and the fine pin holes of the silicon nitride film 7 are completely filled up by the silicon oxide film 8, the stacked structure 10 becomes high in resistance to voltage and in reliability. In this state, the polysilicon layer 5 has a film thickness 400 nm and the sheet resistance of 40 $\Omega/\square$.

Figure 2B:
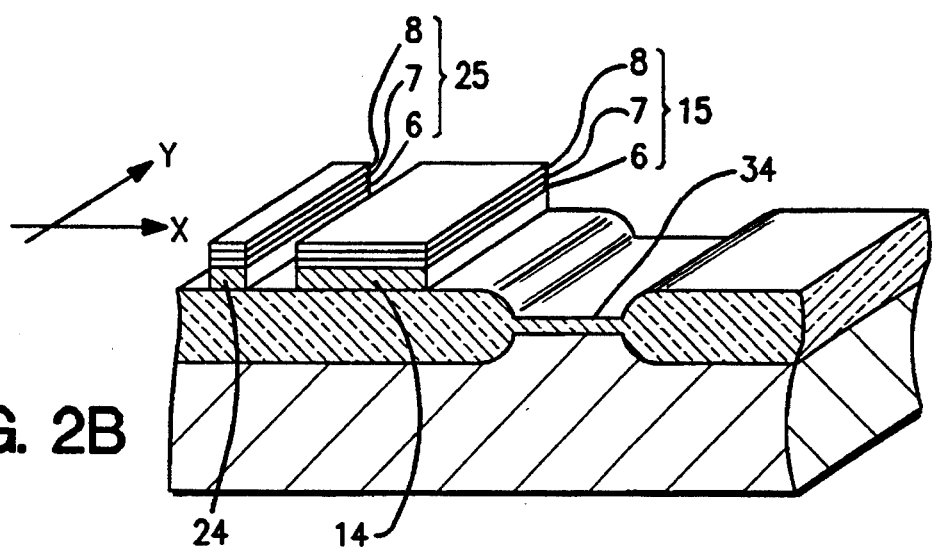
Figure 2C:
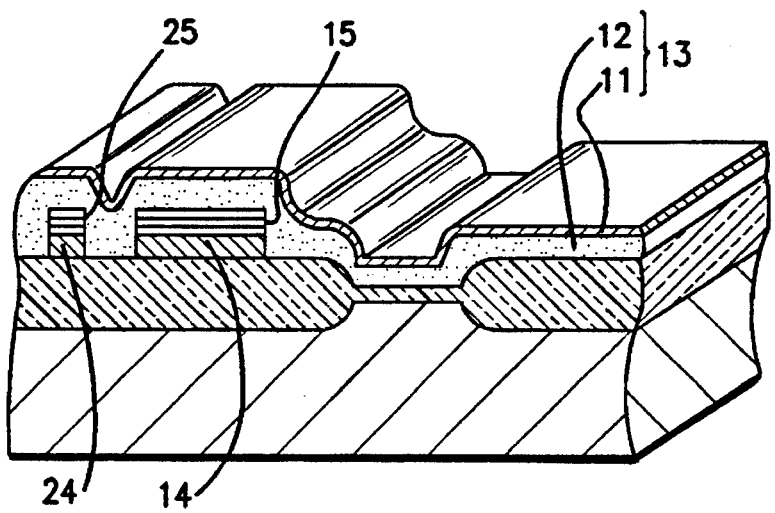

Next, the stacked structure 10 and the polysilicon layer 5 are patterned so that they become coplanar with each other, as shown in FIG. 2B. By this patterning, the lower electrode 14 of the capacitor 40 and the resistor body 24 of the resistor 20 are formed from the polysilicon layer 5, and the dielectric film 15 of the capacitor 40 and the protective insulation film 25 for the resistor 20 are also formed from the stacked structure 10. As described above, each of the lower electrode 14 and dielectric film 15 of the capacitance element 40 is a square plane shape having a plane area of 16 μm×16 μm. As shown in FIG. 3A, the resistor body 24 and the protective insulation film 25 of the resistor 20 have a width W of 5 μm, an effective length L of 50 μm, and a plane shape extending in the Y direction (FIG. 4(A)) in the form of a U letter. The oxide film 64 is then removed and a gate insulating film 34 is formed by the thermal oxidation.

Next, a polycide layer 13 is deposited over the entire surface. This polycide layer 13 consists of a polysilicon layer 11 containing N-type impurities and a refractory metal silicide layer 12 such as WSi formed thereon. Because of the presence of the silicide film 12, the sheet resistance of the polycide film 13 is reduced to a sheet resistance value of 10 $\Omega/\square$.

Figure 2D:
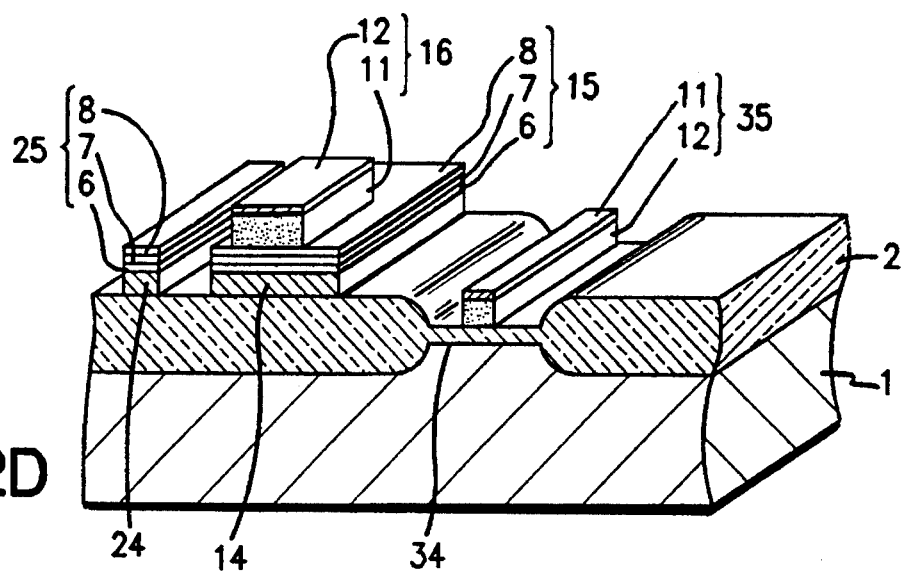

Next, the polycide layer 13 is patterned to form the gate electrode 35 of the IGFET 30 and the upper electrode 16 of the capacitor 40, as shown in FIG. 2D. This upper electrode 16 has a square plane shape of a 12 μm×12 μm, as mentioned above. The plane area of this upper electrode 16 corresponds to a capacitance area and thus determines the substantial capacitance value. The patterning is performed by the dry etching such as reactive-ion etching and the protective insulation film 25 of a stacked structure comprising the silicon oxide films 6 and 8 and the silicon nitride film 7 serves as an etching stopper to protect the resistor 20 as well as the lower electrode 14 of the capacitor 40. Therefore, there is no possibility that the film thickness of the polysilicon films 24 and 14 is reduced. The desired resistance value is thus maintained.

Figure 2E:
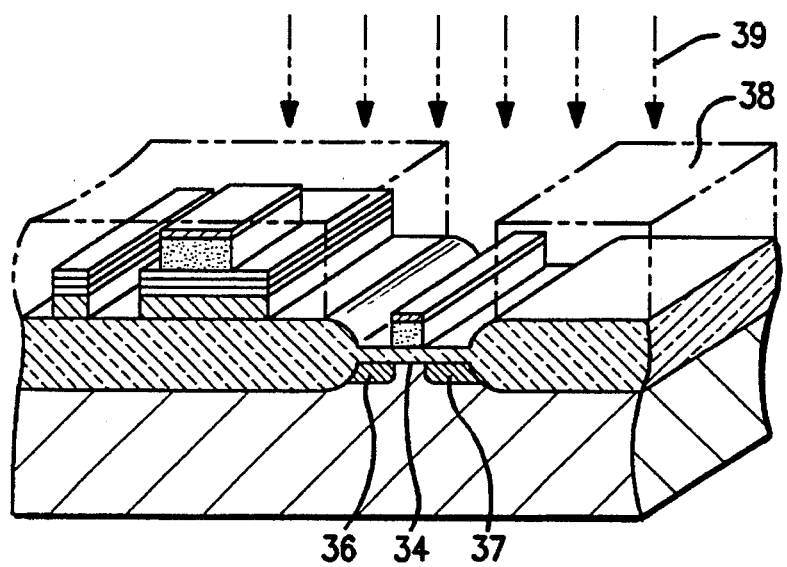

Next, as shown in FIG. 2E, the substrate 1 is covered with a photoresist layer 38 except the active region 3 into which the IGFET 30 is formed. N-type impurities 39 such as arsenic are then ion-implanted using the gate electrode 35, the field oxide film 2 and the layer 38 as a mask. After the photoresist 38 is removed, heat treatment for annealing is performed to form the source and drain areas 36 and 37.

Figure 2F:
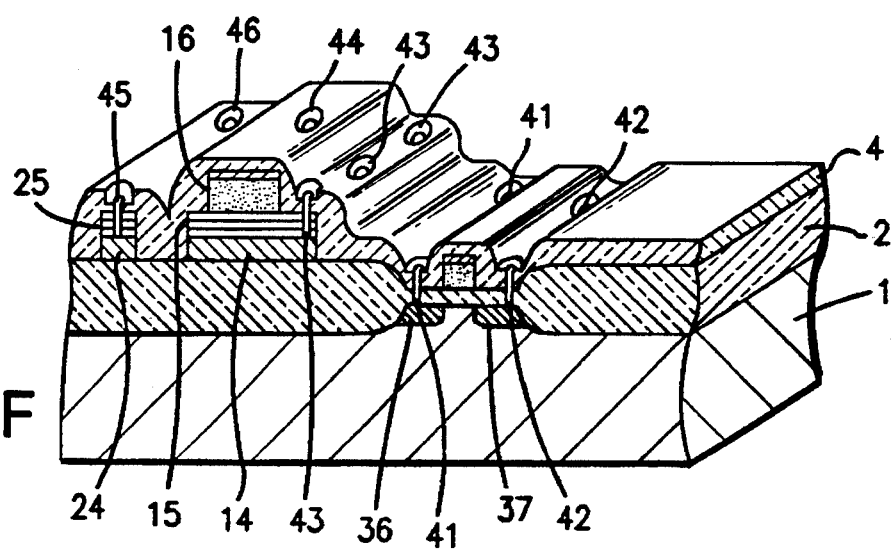

Next, as shown in FIG. 2F, the inter-layer insulation film 4 such as a silicon oxide film, a PSG film, or a BPSG film is formed over the entire surface, and the contact holes 41, 42, 43, 44, 45, and 46 are formed in the layer 4 by the relative ion etching. In this step, the silicon nitride film 7 serves as an effective etching stopper, and hence, after the inter-layer insulation film 4 and the silicon oxide film 8 are selectively removed by the reactive-ion etching, the underlying silicon nitride film 7 and silicon oxide film 6 are selectively removed by a wet etching. With the process as described very fine contact holes 43, 45, and 46 can be formed without damaging the surfaces of the polysilicon lower electrode 14 and resistor body 24.

Finally, a metal such as aluminum is deposited over the entire surface and patterned to form the electrodes 51 to 56, as shown in FIG. 1.

As has been described hereinbefore, the resistor body 24 and the lower electrode 14 are patterned at the same time. Therefore, the device fabrication can be made simpler, and the position relationship between the resistance element and the lower electrode of the capacitance element can be precisely set to a predetermined value because there is no an alignment error or lighgraphy. In addition, a plurality of contact holes 43 are formed in line along the side of the upper electrode 16 to expose a plurality of parts of the lower electrode 14 and the metal electrode 53 are connected to the respective parts of the lower electrode 14. Accordingly, the lower electrode 14 becomes uniform in electric potential to thereby obtain a desired capacitance value.

Since the protective insulation film deposited on the upper surface of the resistor body 24 has a stacked structure of the silicon oxide film 6, the silicon nitride film 7 and the oxide film 8, the device fabrication method is also made simpler from this respect, and an entry of water or a movement of positive ions to the surface vicinity can be prevented by the silicon nitride film 7. Also, since the efficient of thermal expansion of the silicon nitride film 7 is greater than that of the polysilicon layer 24 and the efficient of thermal expansion of the silicon oxide film 6 (8) is smaller than that of the polysilicon layer 24, the thermal expansion is cancelled out by the stacked structure of the silicon oxide film 6 (8) and the silicon nitride film 7, and the stress, which is exerted on the polysilicon resistance body 24 surface during thermal processing or use at high or low temperature, is alleviated. Therefore, there can be obtained a stable resistor in which a fluctuation in the resistance value is less. That is, the present invention is based on new knowledge that the stacked structure of the dielectric film of the capacitance element is also effective as the protective insulation layer of the polysilicon resistance body.

Also, in patterning the gate electrode 35 and the upper electrode 16, the resistor layer 24 is not is reduced in thickness undesirably and therefore a predetermined resistance value is maintained, because the protective insulation layer 25 of the stacked structure is deposited on the upper surface of the resistor film 24. At this time, further, the silicon nitride film 7 serves as an etching stopper in forming the contact holes, each of the holes can be formed fine without damaging the surface of each of the polysilicon layers 14 and 24.

Figure 6:
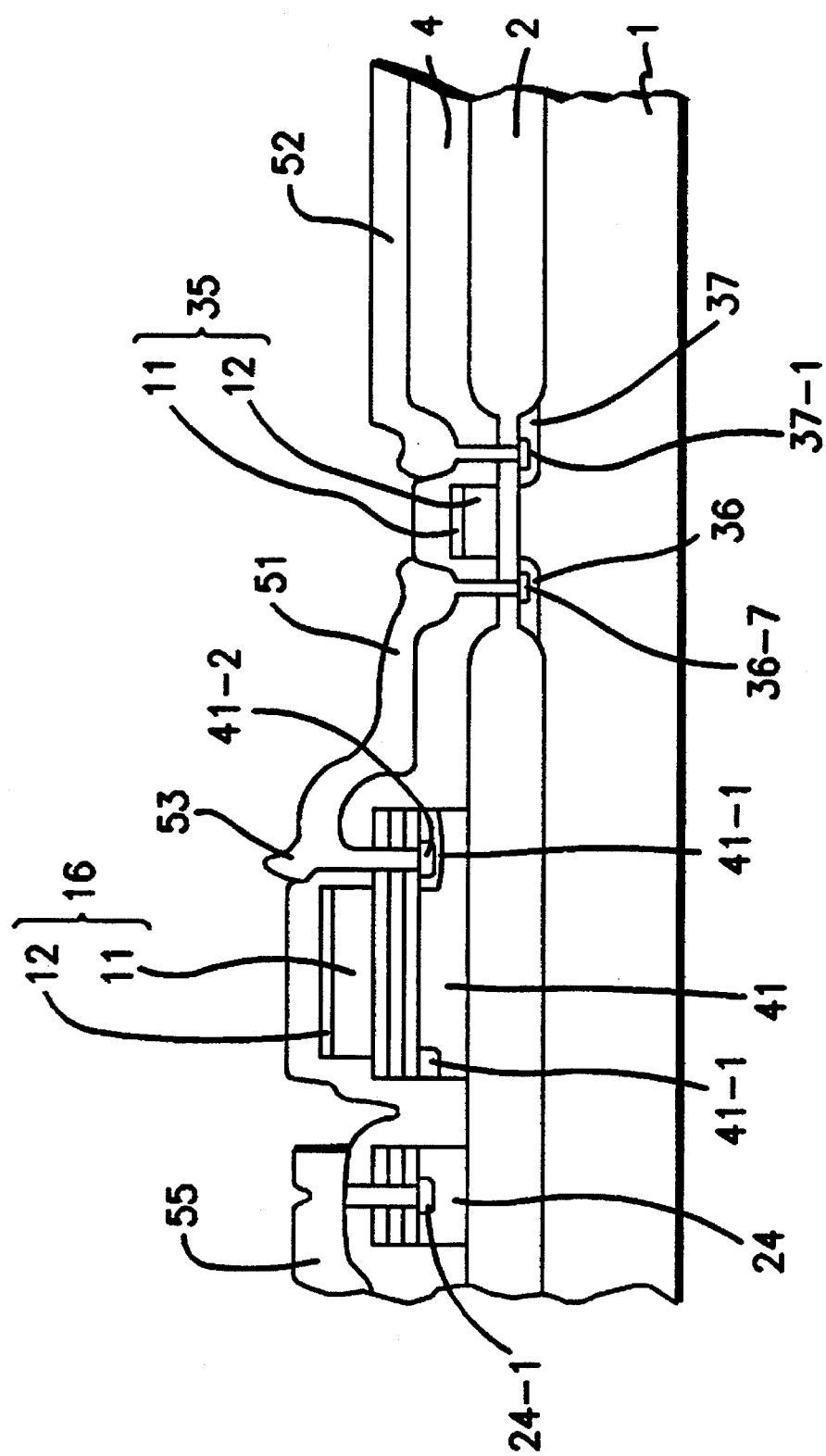
FIG. 6 is a sectional view illustrative of a device according to another embodiment of the present invention.

In this embodiment, the photoresistor layer 38 (see FIG. 2E) is formed with a window that exposes not only the IFGET part 30 but also the capacitor part. Accordingly, the impurities ions are further implanted into a part of the lower electrode 41 which is not shaded with the upper electrode 16. A highly-doped region 41-1 is thereby formed in the lower electrode 41, as shown in FIG. 6. Further in this embodiment, after the contact holes 41–46 are formed in the interlayer insulating film 4 (see FIG. 2F), phosphorus ions are implanted to thereby form a high-doped contact regions 36-1, 37-1, 41-2 and 24-1, as shown in FIG. 6. The contact resistance is thereby lowered.

It is apparent that the present invention is not limited to the above embodiments but may be changed and modified without departing from the scope and spirit of the invention.

What is claimed is:

1. A method of fabricating a semiconductor integrated circuit device comprising the steps of:

selectively forming a field insulation layer on a main surface of a semiconductor substrate to define an active region;

forming a first polysilicon layer on said field insulation layer and said active region;

forming a dielectric layer having at least one oxide layer and a nitride layer on said first polysilicon layer;

patterning said dielectric layer and said first polysilicon layer to form a lower electrode of a capacitor made of said first polysilicon layer and a dielectric film of said capacitor made of said dielectric layer;

forming a second polysilicon layer on at least said dielectric film and said active region after the step of pattering said dielectric layer and said first polysilicon layer; and patterning said second polysilicon layer to form an upper electrode of said capacitor and a gate electrode formed on said active region, whereby said upper electrode of said capacitor and said gate electrode are formed after the step of patterning said dielectric layer and said first polysilicon layer.

2. The method as claimed in claim 1, wherein said at least one oxide layer comprises a lower oxide layer and an upper oxide layer and said step of forming said dielectric layer comprises the steps of forming said lower oxide layer by oxidizing a surface of said first polysilicon layer, depositing said nitride layer on said lower oxide layer, and forming said upper oxide layer by oxidizing said nitride layer.

3. The method as claimed in claim 2, wherein said lower oxide layer and said upper oxide layer are each silicon oxide layers and wherein said nitride layer is a silicon nitride layer.

4. The method as claimed in claim 1, wherein said dielectric layer and said first polysilicon layer patterning step also forms a resistor layer from said patterned first polysilicon layer and a protective insulating film from said patterned dielectric layer.

\* \* \* \* \*